(12) United States Patent
Yanagisawa et al.

(10) Patent No.: US 6,593,635 B2
(45) Date of Patent: Jul. 15, 2003

(54) LIGHT RECEIVING SEMICONDUCTOR DEVICE WITH PIN STRUCTURE

(75) Inventors: Masaki Yanagisawa, Yokohama (JP); Hiroshi Yano, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/188,372

(22) Filed: Jul. 3, 2002

(65) Prior Publication Data

US 2003/0017681 A1 Jan. 23, 2003

(30) Foreign Application Priority Data

Jul. 6, 2001 (JP) ........................................ 2001-205999

(51) Int. Cl.$^7$ ...................... H01L 31/075; H01L 31/105
(52) U.S. Cl. ........................ 257/458; 257/459; 257/466
(58) Field of Search ................................ 257/458, 459, 257/466

(56) References Cited

U.S. PATENT DOCUMENTS

| | | | | |
|---|---|---|---|---|
| 5,436,470 A | * | 7/1995 | Nakajima | ..................... 257/24 |
| 6,081,020 A | * | 6/2000 | Frahm et al. | ................ 257/458 |
| 6,489,659 B2 | * | 12/2002 | Chakrabarti et al. | ........ 257/460 |

FOREIGN PATENT DOCUMENTS

| | | | | |
|---|---|---|---|---|
| JP | 9-213988 | 8/1997 | ........... | H01L/31/10 |

OTHER PUBLICATIONS

Yano et al., "Fabrication of Low Dark Current mesa–Type GaIn as pin PDs on 3–Inch Diameter InP Substrate", Proceedings of the 1999 Engineering Science Society Conference of IEICE SC–2–3, pp. 435–436.

S. Sloan, "Processing and Passivation Techniques for Fabrication of High–Speed InP/InGaAs/InP Mesa Photodetectors", Oct. 1989 Hewlett–Packard Journal, pp. 69–75.

Carey et al., "Leakage Current in GaInAs/InP Photodiodes Grown by OMVPE", Journal of Crystal Growth 98 (1989) 90–97.

Ohnaka et al., "A Low Dark Current InGaAs/InP p–i–n Photodiode with Covered Mesa Structure", IEEE Transaction on Electron Devices, vol. ED–34, No. 2, Feb. 1987, pp. 199–204.

Ota et. al., "Protective coating on the p–n junction of In$_{0.53}$Ga$_{0.47}$As/InP p–i–n planar diodes by vacuum–evaporated glass", J. Appl. Phys. 61(1), Jan. 1, 1987, pp. 404–410.

\* cited by examiner

*Primary Examiner*—Allan R. Wilson
(74) *Attorney, Agent, or Firm*—Smith, Gambrell & Russell, LLP

(57) ABSTRACT

The present invention relates to a PIN photo diode, whish shows both high sensitivity and superior high frequency performance by the reduction of the dark current and the intrinsic capacitance. The PIN diode comprises a substrate made of InP, n-type layer made of InGaAs doped with Si, i-type layer made of GaInAs with unintentionally doped, and the p-type layer made of GaInAs doped with Zn, respective layers are sequentially grown and formed to a mesa structure by conventional technique. A passivation layer of InP covers the p-type layer and the i-type layer. The thickness h2 of a center region of the p-type layer is thinner than the thickness h1 of other region surrounding the center. By the configuration, the reduction of the dark current, the enhancing of the high frequency performance by the reduction of the intrinsic capacitance, and the improvement of the sensitivity by the decreasing the absorption in the p-type layer are achieved.

14 Claims, 10 Drawing Sheets

LIGHT RECEIVING SEMICONDUCTOR DEVICE WITH PIN STRUCTURE

BACKGROUND OF THE INVENTION

1. Field of the Invention

The present invention relates to a light receiving semiconductor device with a PIN configuration used in an optical data transmission.

2. Related Prior Arts

A PIN-PD (PIN-Photo Diode) is used in an optical fiber communication as a light detecting device. In particular, the PIN-PD with a mesa structure is widely used in an optoelectronic integrated circuit (OEIC) as the light receiving optical device. In the OEIC, an optical element and electronic elements are integrated on the same semiconductor substrate, which provides high performance and cost-effective devices realizing the higher transmission rate and the larger capacity of the communication system. The PIN-PD with the mesa structure is superior to a planar structure type PD in various viewpoints. For example, it is easily integrated with other element or devices because it shows better isolation performance from another circuit elements on the same substrate. It is able to size up the wafer diameter because the impurity doping to the semiconductor layers are performed by an epitaxial growth, which shows the good uniformity of the doping. It shows the superior high frequency performance because a material surrounding the mesa structure is removed and small extrinsic stray capacitance is influenced.

On the other hand, since an interface between the p-type layer and i-type layer and a interface between the i-type layer and an n-type layer are exposed to the ambience, such PIN-PD shows a large dark current leaked through side surfaces of the mesa structure. To reduce the dark current, it is ordinarily measured to cover side surfaces of the mesa with an insulating film or some semiconductor films having greater band gap energy than that of the PIN structure. Proceedings of the 1999 Engineering Science Society Conference of IEICE (The Institute of Electronics, Information and Communication Engineers) SC-2-3, pp. 435–436 reported effects of the InP covering layer as a passivation film on the dark current.

FIG. 11 shows a conventional mesa-type PIN-PD with the InP passivation layer. The PD has an InP substrate 20, n-type semiconductor layer 30, i-type semiconductor layer 31, and a p-type semiconductor layer 32 sequentially grown on the substrate 20. The i-type layer 31 and the p-type layer 32 are made of the same material, such as InGaAs, the lattice constant of which matches to InP. The surface of the i-type layer 31 and the p-type layer 32, they are formed into the mesa structure, are covered with an un-doped InP layer 40, the band gap energy of the InP is greater than InGaAs of the i-type layer and the p-type layer. Since the numbers of defects induced in the interface between the semiconductor materials is by far less than those induced between the semiconductor material and the non-semiconductor material, the dark current due to such defects can be eliminated. The proceedings above cited also reported that the high frequency performance of the mesa-type PIN-PD having the InP passivation layer realized the responsive at 2 GHz under the presetting bias condition.

However, the current and the future optical communication system require higher frequency performance, 10 GHz or more, to the PIN-PD. The PIN-PD shown in FIG. 11 would be hard to suit for such high performance system. The high frequency response of the PIN-PD having the InP passivation layer depends on the intrinsic resistance R and the capacitance C of the device itself. In the device shown in FIG. 11, since Zinc (Zn) atoms as the p-type dopant in the p-type layer 32 diffuse into the i-type layer 31, which results on the increasing of the depletion capacitance, thus limits the high frequency performance. To reduce the intrinsic capacitance of the PIN-PD, the diameter of the mesa structure must be small. However, this brings the deterioration of the sensitivity.

FIG. 9 shows the relation of the intrinsic capacitance and the sensitivity to the thickness of the p-type layer 32 for the conventional PD shown in FIG. 11. In FIG. 9, circles denote the sensitivity, while the rectangles correspond to the capacitance. Similarly, FIG. 10 shows the relation of the dark current of the PD to the thickness of the p-type layer 32. Here, the diameter of the light receiving area is 100 um, and the measurement in FIG. 9 is performed under −3V reverse biased condition.

As shown in FIG. 9, the sensitivity and the capacitance improve as the thickness decreases. By setting the thickness of p-type GaInAs layer 32 in FIG. 11 from 250 nm to 50 nm, the capacitance decreases to $\frac{2}{3}$. This is because of the reduction of the diffusion of Zn atoms into the i-type layer. Although the capacitance decreases and the sensitivity increases by thinning of the p-type layer 32, the dark current increases as shown in FIG. 10.

The object of the present invention is to provide the semiconductor optical device in which the sensitivity consists with the high frequency performance without increasing the dark current.

SUMMARY OF THE INVENTION

To solve the problem, a PIN-PD of the present invention comprises a semiconductor substrate, a first semiconductor layer of a first conducting type, a second semiconductor layer made of unintentionally doped semiconductor, and a third layer of a second conducting type different with the first conducting type. The second layer and the third layer are made of the first semiconductor material and form a first mesa structure. The third layer has a first region and a second region surrounding the first region therein, a thickness of the first region is thinner than that of the second region. Further, the PIN-PD of the present invention has a fourth layer made of a second semiconductor material, the fourth layer covering the first layer, the second layer and the third layer therewith, the band gap energy of the fourth layer is greater than that of the first semiconductor material.

According to the configuration of the present invention, the sensitivity is enhanced because of the decreasing of the light absorption within the third layer, and the intrinsic capacitance is reduced because impurities doped in the third layer are prevented diffuse into the second layer. Therefore, the operation frequency over 40 GHz will be attained.

The semiconductor substrate and the second semiconductor material are preferred to be InP, while the first material is preferred to be InGaAs, the lattice constant of which matches to the InP.

Further aspect of the present invention, the first conducting type is n-type and the second conducting type is p-type, while the second layer and the fourth layer is unintentionally doped, thus forms a PIN-PD. The invention of the present invention has a structure that the third layer consists of the first region and the second region surrounding the first region therein. The electrode contacting to the third layer is formed in the first region. By this configuration, the light receiving area of the third layer is able to expand, thus enhancing the sensitivity.

Another aspect of the present invention is that the electrode contacting to the third layer is formed in the second region of the third layer. With this configuration, further reducing of the dark current and the intrinsic capacitance is possible.

The thickness of the second region of the third layer is preferred to be greater than 0.2 um and not greater than 0.5 um. The leak current flowing along the side surface of the third layer and that of the second layer increases when the thickness is below 0.2 um, while the intrinsic capacitance increases when the thickness is over 0.5 um.

On the other hand, the thickness of the first region of the third layer is preferred to be greater than 0.02 um and not greater than 0.25 um. In the case that the thickness below 0.02 um, the intrinsic resistance of the device increases, while the capacitance increases when the thickness is over 0.25 um.

Further scope of applicability of the present invention will become apparent form the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE INVENTION

Detailed description of embodiments of the present invention will be described referring to the accompanying drawings from FIG. 1 to FIG. 4. Constituents identical to each other or those having functions identical will be referred to with numerals of letters identical to each other without repeating their over lapping explanations.

The First Embodiment

Figure 1:
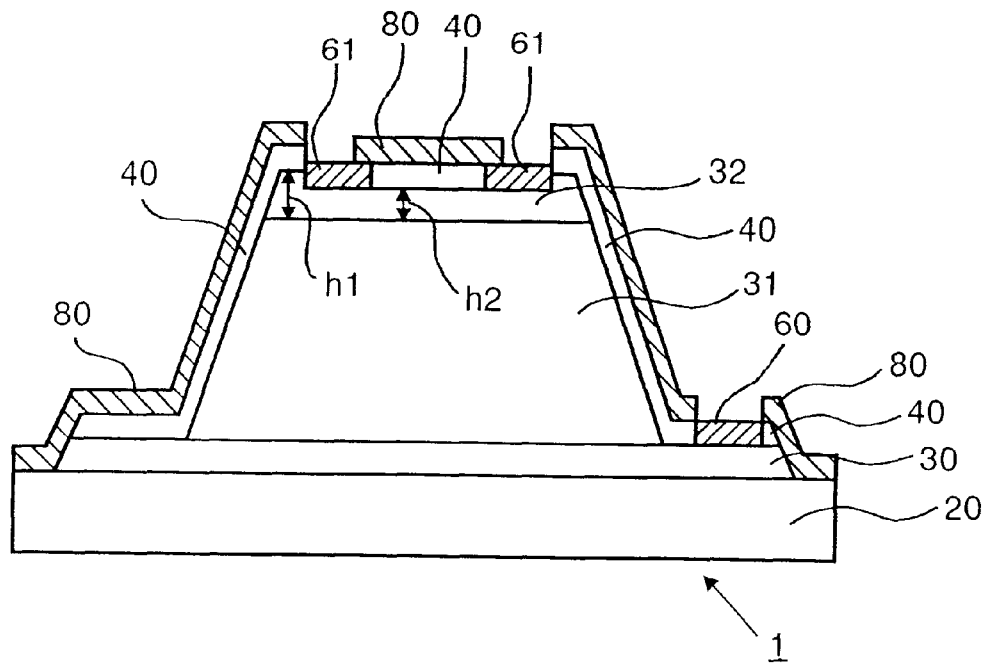
FIG. 1 is a cross sectional view in accordance with the first embodiment of the present invention.

As shown in FIG. 1, a PIN-PD 1 of the present invention comprises of a first semiconductor layer 30 having a first conducting type, an i-type semiconductor layer 31, which is referred to a second semiconductor layer, and a third semiconductor layer 32 having a second conducting type. The i-type layer 31 and the third layer 32 forms a first mesa structure. The third layer 32 consists of a first region with a thickness h2 and a second region with a thickness h1. The second region surrounds the first region. The first region provides the primary function of the light sensing. The first region of the third layer 32 has electrodes 61 of the second conducting type, which contacts to the third layer 32 of the second conducting type.

The first layer 30 forms a second mesa structure. The second mesa locates beneath the first mesa structure. A portion not contacting to the i-type layer 31 is exposed. On the surface of the second mesa structure of the first layer, another electrode 60 is formed so as to contact to the first layer 30. The upper and side surface of the third layer, the side surface of the second layer, and the surface of the first layer, except for the portion where the electrodes are formed, are covered with a fourth semiconductor layer 40 as a passivation layer.

A first insulating film 80 is provided on the surface of the substrate 20, the side surface of the first layer 30, and the surface of the passivation layer 40. The film 80 has openings on the first electrode 60 and the second electrode 61.

The semiconductor substrate 20 is an InP doped with iron (Fe) at a concentration from 0.7 wt ppm to 0.8 wt ppm. The first layer is a Si-doped GaInAs at a concentration of about $4 \times 10^{18}$ cm$^{-3}$ with a thickness of about 500 nm. Not only GaInAs, but also InP or another semiconductor material whose lattice constant matches to the InP substrate are applicable for the first layer 30.

The i-type layer 31 consists of unintentionally doped (un-doped) GaInAs with a thickness about 2.5 um. In general, un-doped GaInAs shows an n-type conducting by the residual impurities.

The third layer 32 consists of a GaInAs doped with Zn at a concentration of $1 \times 10^{19}$ cm$^{-3}$, which shows the second conducting type different from the first conducting type. The thickness of the second region h1 of the third layer is about 300 nm and that of the first region h2 is 50 nm. It is reasonable to secure the second region thicker than 200 nm in order to reduce the dark current flowing along the side surface of the i-type and the third layer. On the other hand, it is favorable for the second region of the third layer to be thinner than 500 nm to reduce the intrinsic capacitance.

To decrease the thickness of the first region h2 brings not only a high sensitivity and less intrinsic capacitance but also the increasing of the intrinsic resistance. This leads the inferior sensitivity and also the high frequency performance, since it requires a longer time for holes to drift from the i-type layer 31 to the second electrode 61 through the third layer 32. The thickness of the first region h2 of the third layer 32 is preferred to be ranging from 0.02 um to 0.25 um.

The passivation layer 40 made of the second semiconductor material is favorable to have a wider band gap energy than that of the first material. In the present embodiment, the first material is InGaAs and the second material is InP, which is un-doped with thickness from 0.1 um to 0.5 um. It is favorable for the passivation layer 40 to be thicker than 300 nm to cover and protect the first mesa structure completely.

The first electrode 60 is made of AuGe containing Ni therein. The thickness of AuGe eutectic alloy and Ni are 100 nm and 30 nm, respectively. The second electrode 61 is Ti/Pt/Au deposited sequentially and the thickness of respective metals is 20 nm, 40 nm, and 100 nm.

The insulating film 80 is made of SiN of thickness from 100 nm to 200 nm. Although the i-type layer 31 and the third layer 32 are made of the same semiconductor material GaInAs with a band gap energy of 0.75 eV, the former shows an $n^-$-type conducting type, while the latter shows the second conductive type different from the i-type layer 31. On the other hand, the passivation layer 40 is made of InP, which has a band gap energy wider than GaInAs of the i-type layer 31 and the third layer 32.

Figure 3A:
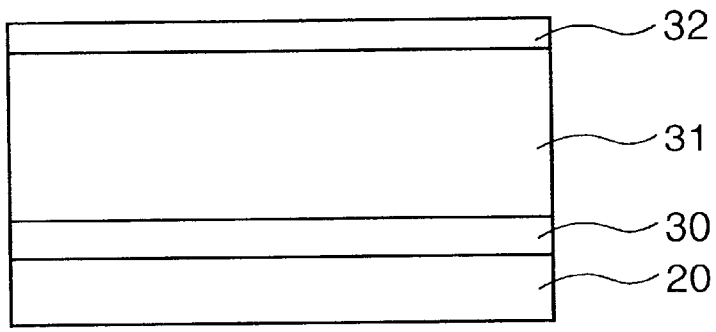
FIGS. 3(a) through 3(d) and 4(a) through 4(c) show manufacturing process steps of the PIN diode in accordance with the FIG. 1.

Next is the description of the manufacturing process of the PIN-PD 1. As shown in FIG. 3(a), the first layer 30, the i-type layer 31 and the third layer 32 are sequentially grown on the semiconductor substrate 20 by a conventional metal organic vapor phase epitaxial (MOVPE) growth technique. A Tri-Ethyl-Gallium (TEG) and a Tri-Methyl-Indium (TMI) with a carrier gas, such as hydrogen, are used for source materials of group III elements, while $AsH_3$ (Arsine) and $PH_3$ (Phosphine) are sources for group V elements. A silicon hydride, such as silane ($Si_2H_6$), is applicable for the source of the n-type doping, while a di-ethyl-Zinc (DEZ) is for the p-type doping. The composition and the carrier concentration of grown layers are controlled by the flow rate of respective sources. The growth temperatures are set so as not to affect the quality of the growth layer, which are preferred to be typically between 600° C. and 700° C.

Figure 3B:
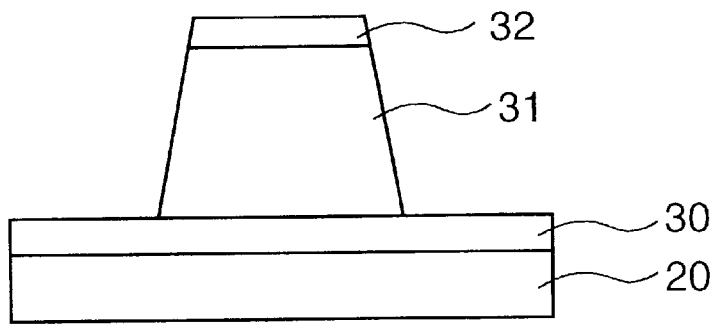
Figure 3C:
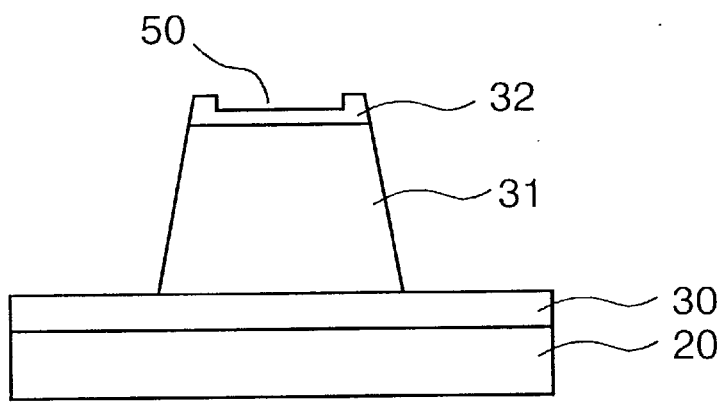
Figure 3D:
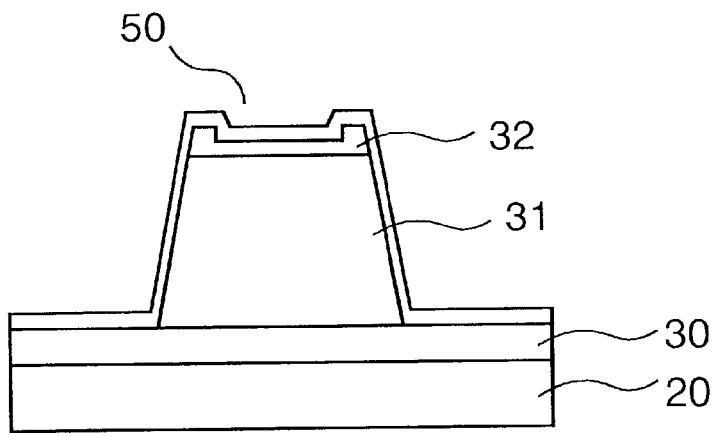

Next, the first etching mask with a circular shape is formed on the third layer 32 (not shown in FIG. 3(b)). A region not covered with the mask is etched to the surface of the first layer 30 with a phosphoric acid ($H_3PO_4$). Consequently, the third layer 32 and the i-type layer 31 are shaped into the mesa structure as shown in FIG. 3(b).

After the first mesa forming, the third layer 32 is processed so as to perform the function of the present invention. The second etching mask (not shown in FIG. 3(c)), which covers the second region of the third layer and its outer region while exposing the first region, is formed onto the third layer. By conventional wet etching technique with phosphoric acid as an etchant, only a first region of the third layer 32 is thinned to the thickness of h2. After the etching, the second region of the third layer 32 is left with maintaining its thickness, thus forms a depression on the surface of the third layer. Removing the etching mask, the passivation layer 40 is formed on the surface of the third layer 32, the i-type layer 31 and the first layer 30 by the conventional MOVPE technique. In this process, it is reasonable to control the quality of the growth layer because the i-type layer 31 and the third layer 32 are made of the same semiconductor material, GaInAs. Only the arsenic source may be controlled to reduce atoms contained in GaInAs dissolving from the surface of the layer.

In the case that the i-type layer 31 and the third layer 32 are different materials to each other, such as GaInAs for the i-type layer 31 and InP for the third layer, both partial pressure of As and P must be controlled independently. This brings the poor quality of the passivation layer 40 and the increasing of the dark current of the PIN-PD.

After growing the passivation layer, a thermal treatment is performed under the condition of temperatures from 550 C. to 700 C. and the period between 90 minutes to 120 minutes. The object of the treatment is, 1) to relieve the stress induced in the interface and consequently to reduce the dark current due to the interface states, and 2) to diffuse Zn atoms contained in the third layer 32 into surrounding layers. This creates the region where the Zn atoms diffuses in the i-type layer 31 and also in the passivation layer 40 vicinity to the third layer 32. By Zn diffusion, the interface between the third layer 32 and the passivation layer 40 moves into the passivation layer 40. This converts the hetro-interface between the third layer and the passivation layer into the homo-interface within the passivation layer. Consequently, it results on the reduction of the dark current flowing along side surfaces of the i-type layer 31 and the third layer 32. Elements diffusing into the fourth layer are not restricted to Zn. Be, Mn, Cd or other atoms showing a p-type conducting is also applicable.

Figure 4A:
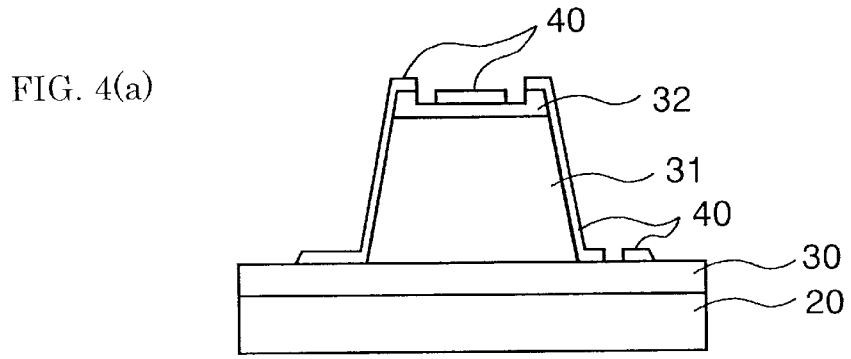
Figure 4B:
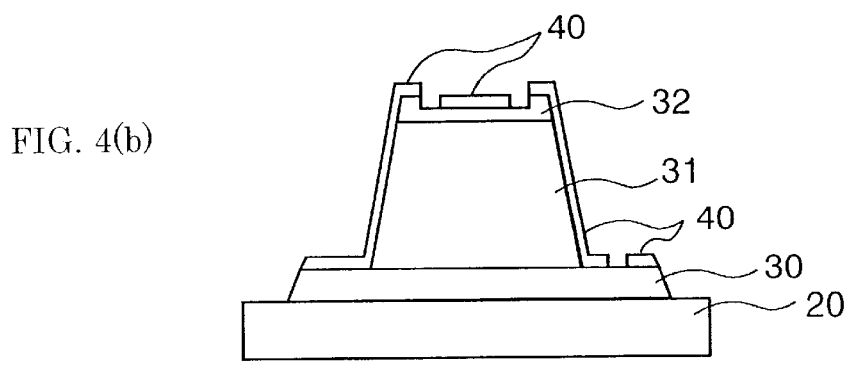
Figure 4C:
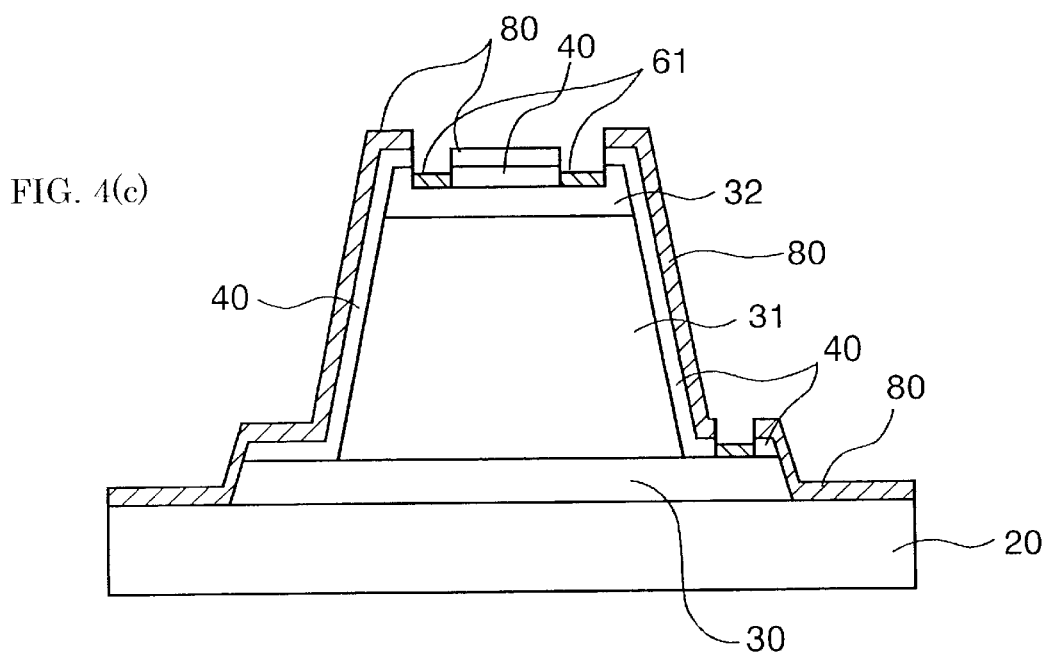

After the thermal treatment, another etching mask is formed on the surface of the passivation layer 40 so as to expose respective electrode regions on the third layer 32 and the peripheral of the first mesa structure including the i-type layer 31 and the third layer 32 therein. The exposed portion of the passivation layer 40 is completely etched by hydrochloric acid to the underneath layer as shown in FIG. 4(a).

The second mesa structure of the first layer 30 is formed just after the passivation layer etching. Further etching mask is formed so as to cover the region where the second mesa structure is formed. Exposed region is etched by phosphoric acid to the substrate 20, which produces not only the second mesa structure but also the electrical isolation from the surroundings.

After the second mesa forming, the whole structure of the PIN-PD 1 is protected by an inorganic insulating film 80, such as a silicon nitride, deposited by the chemical vapor deposition technique. Respective electrodes are formed by the etching of corresponding regions of the insulating film 80 with a photo-resist as an etching mask, depositing the electrode metals, and removing the residue metals on the photo-resist by the Lift-off technique.

The above mentioned PIN-PD 1 comprises the first layer 30, the i-type layer 31 and the third layer 32, at least the i-type layer and the third layer are made of the first semiconductor material and the passivation layer 80 made of the second material covers and protects the whole layers. The second material has the energy gap greater than the first material and the lattice constant substantially matches to the first material. Therefore, the passivation layer 80 is able to grow epitaxially with a good quality.

Next is an explanation of the superior function of the present PIN-PD 1.

Since the PIN-PD 1 has the thinner region within the third layer 32 on the top of the first mesa structure, the diffusion of Zn atoms in the third layer into the i-type layer is reduced, which decrease the depletion capacitance of the PIN-PD 1 and increase the high frequency performance. Further, it decreases the absorption of the incident light in the third layer 32 and increases photo-induced carriers generated in the i-type layer. Thus, the sensitivity is enhanced.

Since un-doped InP as the second semiconductor material of the passivation layer 40 is grown so as to cover the i-type layer 31 and the third layer 32, and the band gap energy of the passivation layer is greater than the first material, less defects are generated in respective interface, which leads the reduction of the dark current through defects.

Further, since the center portion of the top surface of the third layer is thinned compared to the outer portion thereof, not only the high frequency performance and the light receiving sensitivity, but also the noise due to the dark current can be effectively reduced.

The Second Embodiment

Next will be explained the second embodiment of the present invention.

Figure 2:
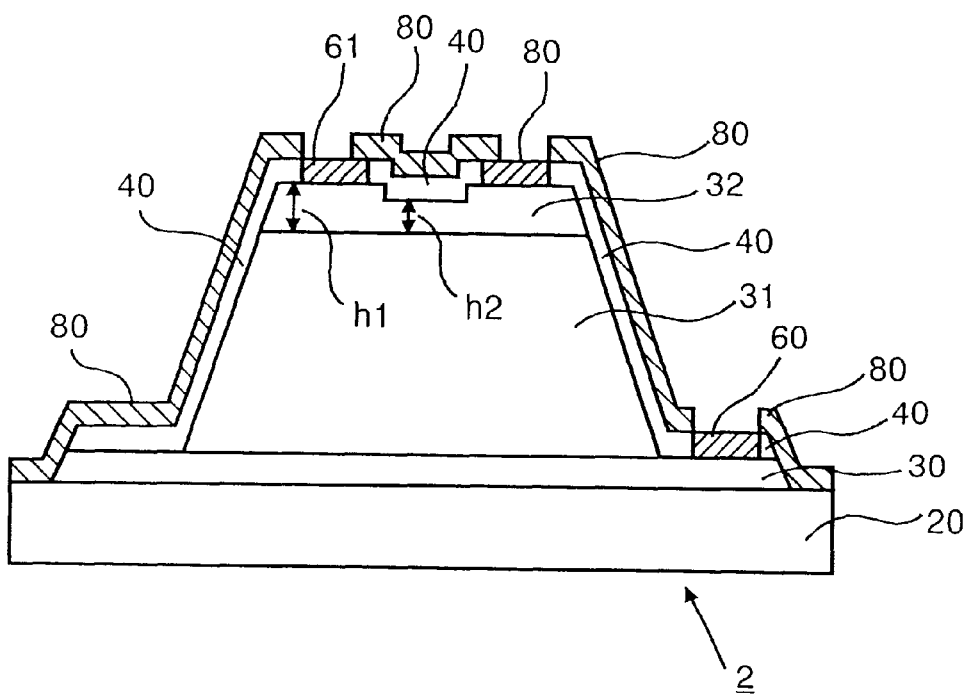
FIG. 2 is a cross sectional view of the second embodiment of the present invention.

As shown in FIG. 2, the primary portion of the PIN-PD 2 is same with the first embodiment except for the top portion of the third layer 32. The size of the first region in the third layer 32 is narrowed and the second electrode 61 is formed on the second region of the third layer 32.

The manufacturing process of the PIN-PD 2 is similar with the PIN-PD 1 except for the formation of the first region. In the first embodiment, the etching mask for thinning the third layer has comparatively wide opening, while in the case of the present embodiment, the mask has an opening that corresponds only to the light receiving region centered in the first mesa structure. Consequently, the second electrode 61 formed subsequently locates on the region where the etching is not performed. Because the second electrode 61 is formed on the second region of the third layer 32 and the distance from the interface between the i-type layer 31 and the third layer 32 is secured, further reduction of the dark current is achieved. Moreover, the intrinsic capacitance of the device is decreased, thus enhancing the high frequency performance of the PIN-PD 2.

Figures from FIG. 5 to FIG. 8 show experimental results relating to the present invention. Inventors have investigated the intrinsic capacitance, the sensitivity and the leak current of the PIN-PD to the thickness of the third layer 32.

Figure 5:
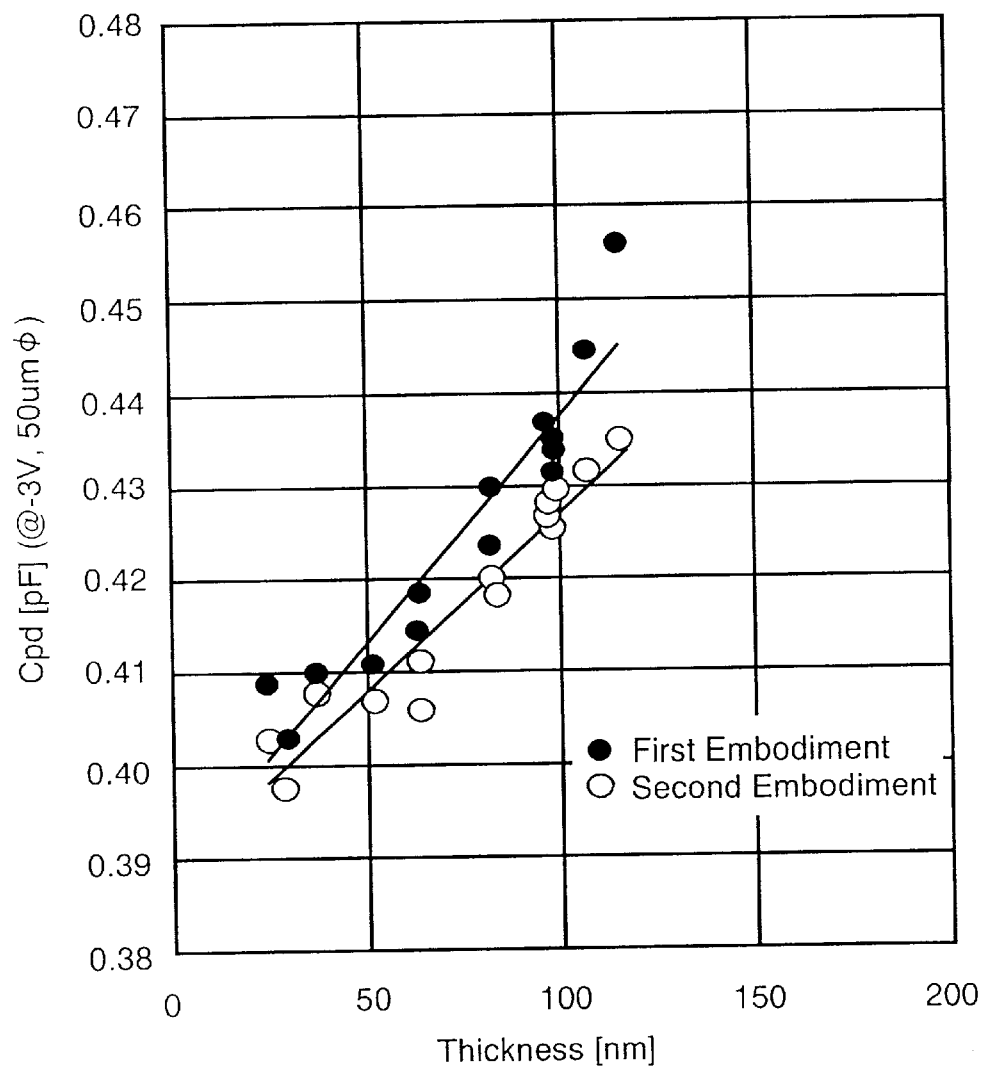
FIG. 5 shows characteristics of the intrinsic capacitance to the thickness of the third layer in accordance with the first and the second embodiment of the invention.

FIG. 5 shows the dependence of the intrinsic capacitance on the thickness h2 of the thinned region in the third layer 32 of the first and the second embodiment. The diameter of the thinned region is 50 um and the capacitance is measured under the reverse biased condition of −3V. Painted circles denote results for the PD of the first embodiment, while open circles denote for the second embodiment.

As shown in the figure, the capacitance decreases in both types of PDs as the thickness of the thinned region decreases. Typical value for the conventional PD, in which the thickness of the third layer is 250 nm, is about 0.47 pF. The reduction to 87% relative to the conventional structure is achieved for the PD of the first embodiment with the thickness of 50 nm for the thinned region. Further 2% reduction is achieved for the PD of the second embodiment. From the measurement, it is recognized that the intrinsic capacitance decreases by thinning the thickness h2 of the center portion of the third layer in the mesa structure for both types of PDs.

Figure 6:
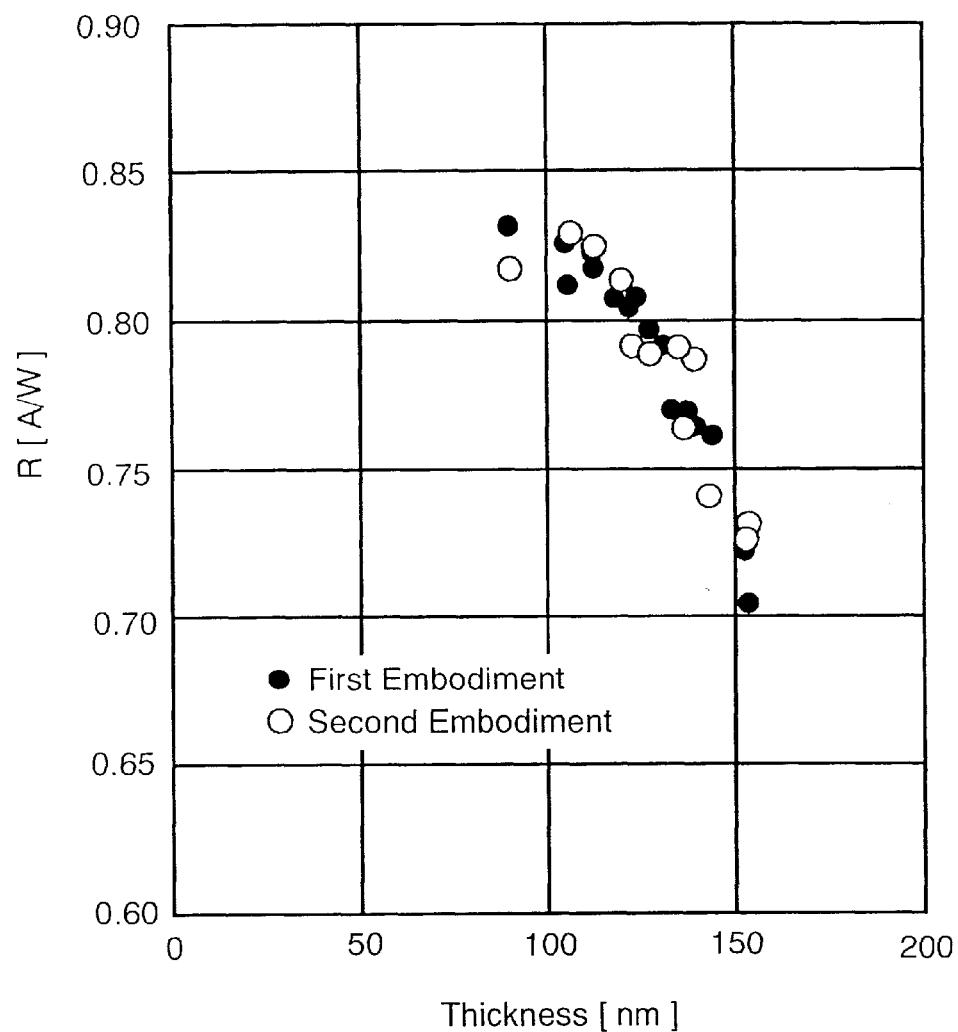
FIG. 6 shows relation of the sensitivity to the thickness of the third layer of the first and the second embodiment of the present invention.
Figure 9:
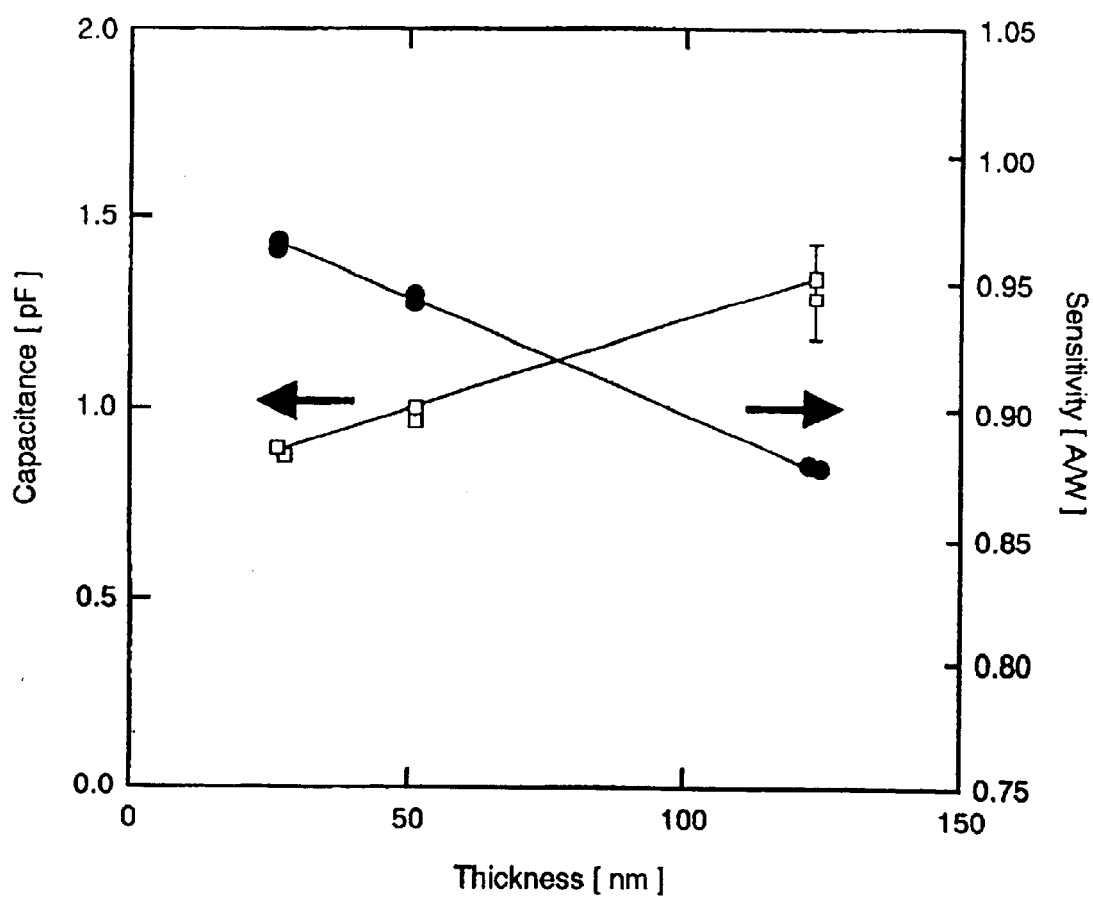
FIG. 9 shows a relation of the intrinsic capacitance to the thickness of the p-layer of the conventional PIN photo diode with a passivation semiconductor layer shown in FIG. 11.
Figure 10:
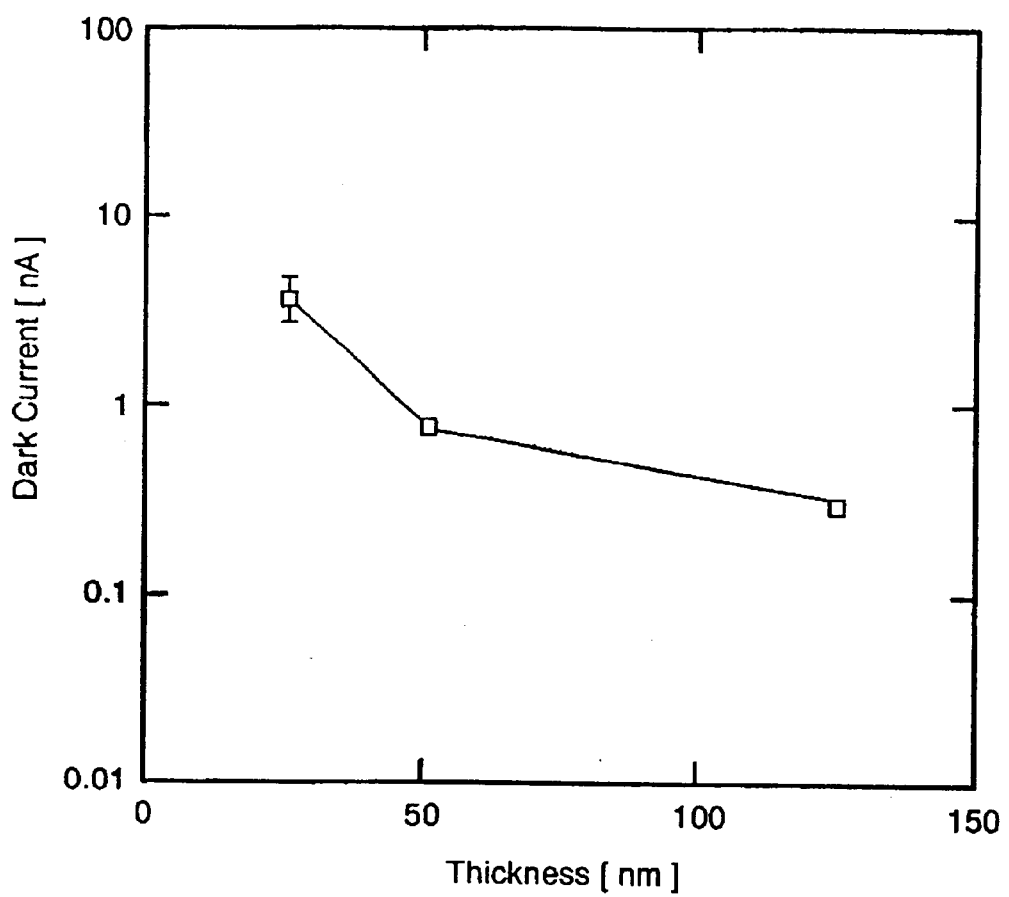
FIG. 10 shows a relation of the dark current to the thickness of the p-type layer of the conventional PIN photo diode shown in FIG. 11.
Figure 11:
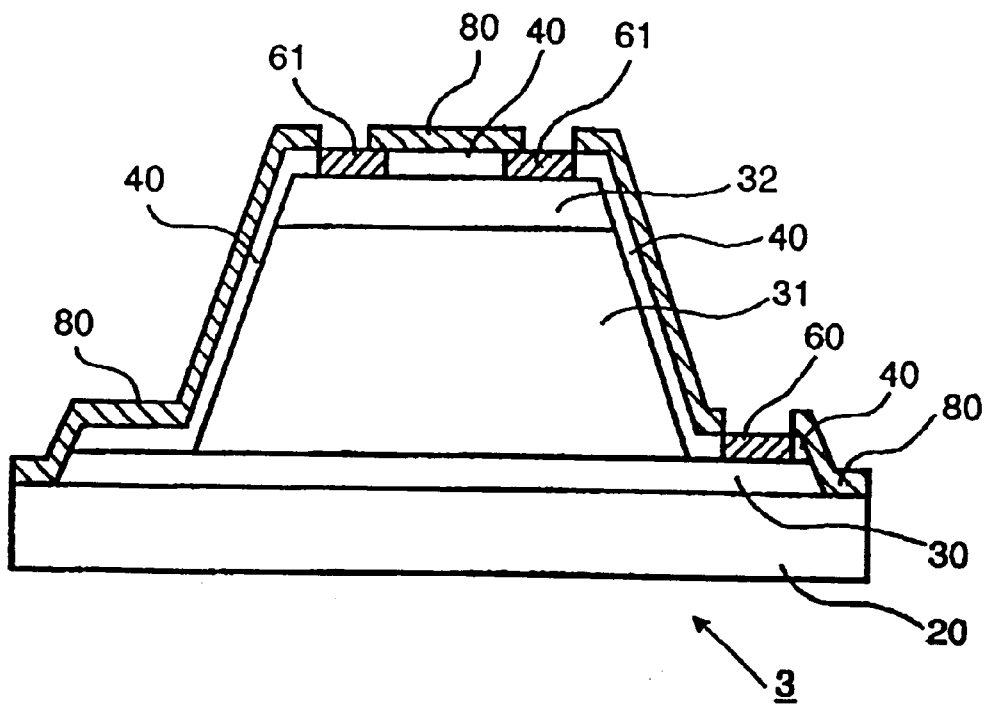
FIG. 11 shows a cross sectional view of the conventional PIN photo diode with a passivation semiconductor layer.

FIG. 6 shows the relation of the sensitivity of PDs to the thickness of the thinned region. Similar to FIG. 5, painted circles denote results for the first embodiment, while open circles denote for the second embodiment. As recognized in FIG. 6, both types of PDs show large sensitivity as the thickness h2 decreases. The difference between two types of PDs is undistinguishable. Over 0.80 A/W sensitivity is available for the thickness below 125 nm. The reason that the magnitude of the sensitivity is small compared to that in FIG. 9 is the diameter of the thinned region is as half as the case in FIG. 9.

Figure 7:
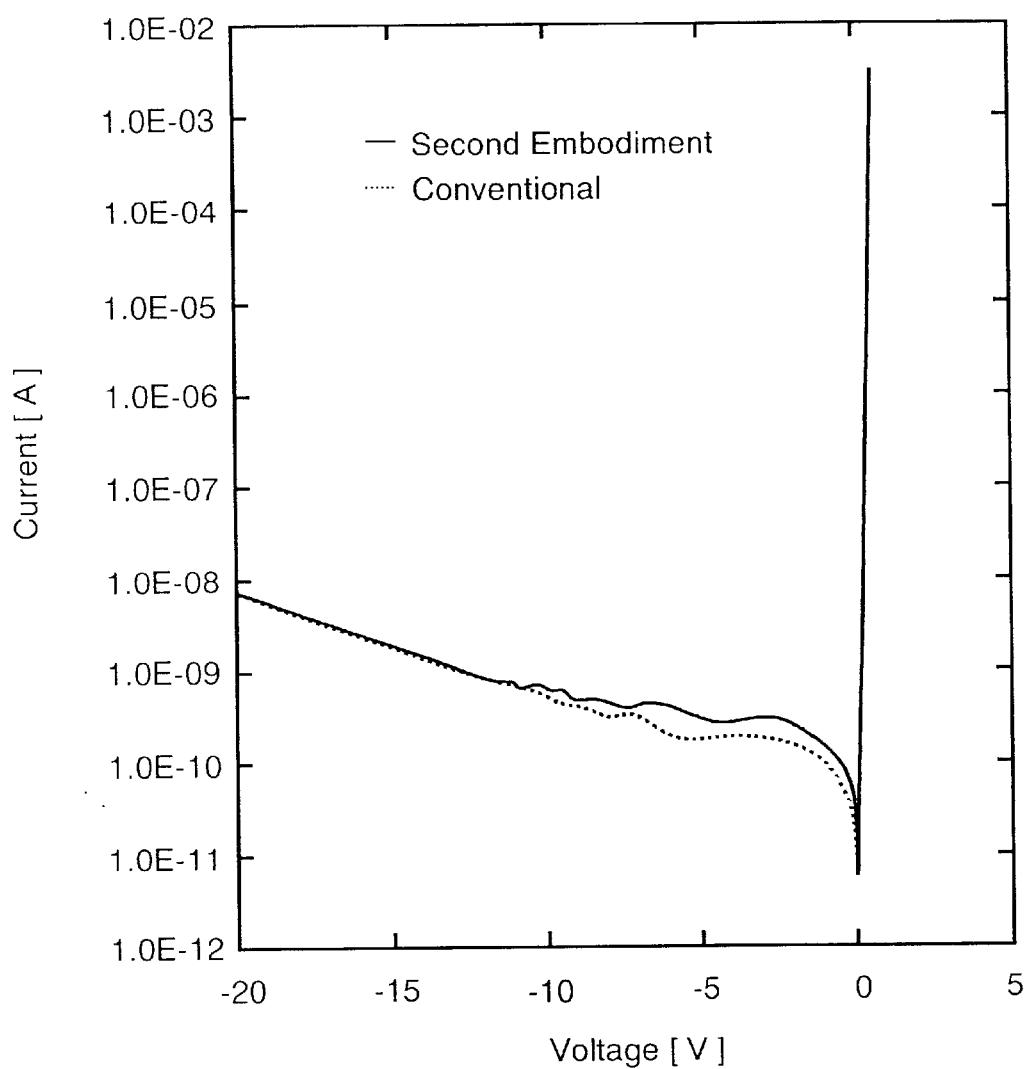
FIG. 7 shows a current-voltage characteristics of the PIN diode in accordance with the second embodiment of the present invention.

FIG. 7 shows the comparison of the current voltage characteristics of the PD according to the second embodiment with the conventional PD. The solid line denotes for the second embodiment, while the dotted line corresponds to the conventional PD. In the latter, the third layer has the uniform thickness. The thickness of the center region of the former PD is thinned to 90 nm. As recognized in FIG. 7, both types of PDs show the similar behavior, particularly the leak current at the large reverse bias condition of both types of PDs are almost same. From the result, it is recognized that the existence of the passivation layer with the energy gap greater than that of the surrounded material thereby and the thickness of the third layer at the edge of the mesa structure dominates the magnitude of the leak current.

Figure 8:
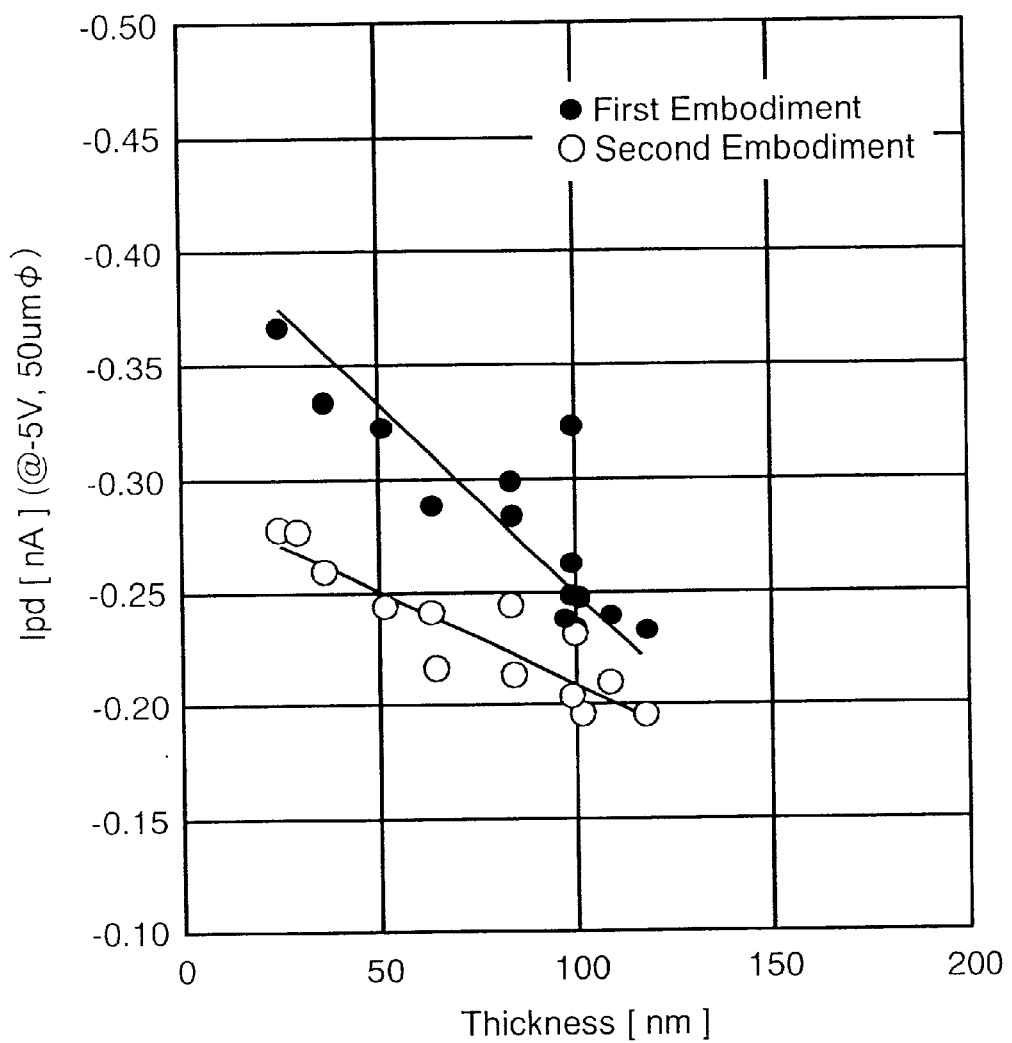
FIG. 8 shows characteristics of the dark current to the thickness of the third layer of the first and the second embodiment.

FIG. 8 shows the relation of the dark current to the thickness of the thinned region of the third layer in both types of PDs. Measurements are performed by applying −5V reverse bias. Painted circles correspond to the first embodiment, and open circles denote results for the second embodiment. Explicitly understood from FIG. 8, the PD according to the second embodiment shows superior characteristics to that of the first embodiment. This is because the electrode formed on the third layer is located in the region where the thickness of the third layer is left thick, while in the first embodiment, it is formed on the thin region. However, the magnitude of the leak current can be suppressed enough in both types of PDs of the present invention.

From the explanation thus described, the PD of the present invention shows the good high frequency performance and the sensitivity because the thickness of the third layer is decreased, which leads the reduction of the intrinsic capacitance and the light absorption within the third layer.

By maintaining the thickness of the outer region of the third layer to be thick enough, the magnitude of the leak current can be remained low enough. Therefore, according to the present invention, the PD, which has a good high frequency performance and a good sensitivity without increasing the leak current, will be available.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light receiving semiconductor device comprising:
   a semiconductor substrate;
   a first semiconductor layer provided on said semiconductor substrate, said first layer being doped with a first conducting type impurities;
   a second semiconductor layer provided on said first layer and made of a first semiconductor material, said second layer being unintentionally doped;
   a third layer provided on said second layer and made of the first semiconductor, said third layer being doped with a second conducting type impurities; and
   a fourth semiconductor layer made of a unintentionally doped second semiconductor material, said fourth layer covering the first layer, the second layer and the third layer,
   wherein a thickness of a first region of said third layer is thinner than a thickness of a second region of said third layer, the second region surrounding the first region therein.

2. The light receiving device according to the claim 1, wherein a band gap energy of the second semiconductor material is larger than a band gap energy of the first semiconductor material.

3. The light receiving device according to claim 2, wherein the first semiconductor material is GaInAs, a lattice constant of GaInAs being substantially matched to InP, and the second semiconductor material is InP.

4. The light receiving device according to claim 1, further comprising an insulating film covering the fourth layer therewith.

5. The light receiving device according to claim 1, wherein the first conducting type is n-type and the second conducting type is p-type.

6. The light receiving device according to claim 1, further comprising an electrode provided on the first region of the third layer.

7. The light receiving device according to claim 2, further comprising an electrode provided on the second region of the third layer.

8. The light receiving device according to claim 1, wherein the thickness of the peripheral portion of the third layer is greater than 0.2 um and not greater than 0.5 um.

9. The light receiving device according to claim 1, wherein the thickness of the center portion of the third layer is greater than 0.02 nm and not greater than 0.25 um.

10. A light receiving device comprising:

a semiinsulating InP substrate;

an n-type InGaAs layer, said n-type layer being substantially lattice-matched to the InP substrate;

an i-type InGaAs light absorbing layer, said i-type layer being substantially lattice-matched to said InP substrate;

a p-type InGaAs layer, said p-type layer being substantially lattice-matched to said InP substrate; and an un-doped InP layer covering said p-type layer, said i-type layer and said n-type layer therein, wherein a thickness of a center portion of said p-type layer is thinner than a thickness of a peripheral portion surrounding said center portion therewith of said p-type layer.

11. The light receiving device according to claim 10, wherein the thickness of the center portion of the p-type layer is greater than 0.02 um and not greater than 0.25 um.

12. The light receiving device according to claim 10, wherein the thickness of the peripheral portion of the p-type layer is greater than 0.2 um and not greater than 0.5 um.

13. The light receiving device according to claim 10, wherein the p-type layer is doped with Zn.

14. The light receiving device according to claim 10, wherein the n-type layer is doped with Si.

* * * * *